(12) United States Patent
Huelsing et al.

(10) Patent No.: US 11,656,293 B2
(45) Date of Patent: May 23, 2023

(54) METHOD AND APPARATUS FOR PARAMETERIZING AN ELECTROCHEMICAL BATTERY MODEL FOR A BATTERY BASED ON DATA FROM A PLURALITY OF BATTERIES

(71) Applicant: Robert Bosch GmbH, Stuttgart (DE)

(72) Inventors: Tobias Huelsing, Stuttgart (DE); Christian Simonis, Leonberg (DE); Christoph Kroener, Rosstal (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 17/484,428

(22) Filed: Sep. 24, 2021

(65) Prior Publication Data
US 2022/0099750 A1    Mar. 31, 2022

(30) Foreign Application Priority Data
Sep. 29, 2020   (DE) .................. 10 2020 212 282.2

(51) Int. Cl.
*G01R 31/392*     (2019.01)
*G01R 31/3828*    (2019.01)

(52) U.S. Cl.
CPC ....... *G01R 31/392* (2019.01); *G01R 31/3828* (2019.01)

(58) Field of Classification Search
None
See application file for complete search history.

(56) References Cited

U.S. PATENT DOCUMENTS

2013/0262067 A1* 10/2013 Zhang .................. G05B 23/024
703/8

FOREIGN PATENT DOCUMENTS

EP          3 224 632 B1    10/2017

* cited by examiner

*Primary Examiner* — Jas A Sanghera
(74) *Attorney, Agent, or Firm* — Maginot, Moore & Beck LLP

(57) ABSTRACT

A method for parameterizing an electrochemical battery model of a specific battery of a device, includes providing a current operating feature point of the specific battery and operating feature points of further batteries of a plurality of further devices for various evaluation periods. The operating feature points of the further batteries characterize an operation of a respective further battery within one or more of the evaluation periods based on several operating features. The several operating features are produced depending on characteristics of operating variables of the respective further battery. The method further includes selecting operating feature points of the further batteries that are similar to the current operating feature point of the specific battery, and providing model parameters of the electrochemical battery model that are associated with the current operating feature point and the selected operating feature points.

11 Claims, 3 Drawing Sheets

METHOD AND APPARATUS FOR PARAMETERIZING AN ELECTROCHEMICAL BATTERY MODEL FOR A BATTERY BASED ON DATA FROM A PLURALITY OF BATTERIES

This application claims priority under 35 U.S.C. § 119 to patent application no. DE 10 2020 212 282.2, filed on Sep. 29, 2020 in Germany, the disclosure of which is incorporated herein by reference in its entirety.

FIELD

The disclosure relates to electrical devices operated independently of the mains and having batteries and additionally to measures for determining a state of health (SOH) of the electrical energy stores. Additionally, the disclosure relates to not only mobile but also stationary electrical energy stores.

BACKGROUND

The supply of power to electrical devices and machines operated independently of the mains, such as for example electrically driveable motor vehicles, is frequently provided using batteries.

The state of health of a battery declines appreciably over the course of its life, the effect of which is a declining maximum storage capacity. The extent of the ageing of the battery is dependent on an individual load on the battery, i.e. on the usage behavior of a device operated using the battery, external ambient conditions and on the vehicle battery type.

Although a physical state of health model can be used to determine the present state of health of the energy store based on historical operating state characteristics, this model is inaccurate in certain situations. This inaccuracy of the conventional state of health model hampers prediction of the state of health characteristic. However, the prediction of the characteristic of the state of health of the energy stores is an important technical variable, since it allows a financial assessment of a residual value of the energy store.

An electrochemical battery model can be used to determine the state of health of a battery. This electrochemical battery model is parameterized by a plurality of model parameters and is based on differential equations, which model internal states of equilibrium.

Characteristics of operating variables of a battery with a known or measured state of health which characterize the operation of the battery, such as characteristics of a battery current, a battery voltage (terminal voltage), a battery temperature and a state of charge, for example, can be used to adjust model parameters of the electrochemical battery model. Since the electrochemical battery model depends considerably on the state of health of the battery, the battery model is re-parameterized or model parameters are updated at regular intervals.

SUMMARY

The disclosure provides for a method for parameterizing an electrochemical battery model for a battery of a battery-operated machine and a corresponding apparatus.

According to a first aspect, there is provision for a computer-implemented method for parameterizing an electrochemical battery model of a specific battery of a device, comprising the following steps:

providing a current operating feature point of the specific battery and operating feature points for further batteries of a plurality of further devices for various evaluation periods, wherein the operating feature points characterize the operation of the respective battery within one or more evaluation periods based on several operating features, wherein the operating features are produced depending on characteristics of operating variables of the respective battery;

selecting operating feature points of the further batteries that are similar to the current operating feature point of the specific battery;

providing model parameters of the battery model that are associated with the current operating feature point and the selected operating feature points;

ascertaining at least one fused model parameter depending on the model parameters of the current operating feature point of the specific battery and the selected operating feature points of the further batteries;

signaling the at least one fused model parameter or updating the battery model using the at least one fused model parameter.

The state of health of a rechargeable electrical energy store, in particular a device battery, is usually not measured directly. This would require a series of sensors close to the energy store, which would make the production of such an energy store costly and complex and increase the installation space. In addition, conventional measurement methods for determining the state of health in the devices are not yet available on the market. The current state of health is therefore generally ascertained using a physical ageing model in the devices. This physical state of health model is inaccurate in certain situations and usually exhibits model errors of up to more than 5%.

The physical ageing model is based on an electrochemical battery model which has a series of differential equations for determining equilibrium parameters and is parameterized by means of model parameters. The model parameters of the electrochemical battery model are usually parameterized by means of measuring an overall capacity of the battery or an internal resistance in order to deduce a state of health of the battery. Using an optimizer, the model parameters of the electrochemical battery model can now be determined in a manner known per se based on characteristics of operating variables such as battery voltage (terminal voltage), battery current, battery temperature and state of charge and the specific information regarding the state of health.

The inaccuracy of the physical state of health model also means that it can only indicate the present state of health of the energy store. A prediction of the state of health, which is in particular dependent on the manner of operation of the energy store, such as for example on the level and amount of charge flowing into and out of a device battery, and hence on a usage behavior and on usage parameters, leads to very high fluctuations and inaccuracies of the predictions and is therefore not usable.

State of health (SOH) is the key variable for device batteries as an electrical energy store for indicating a remaining battery capacity or remaining battery charge. The state of health describes an extent of the ageing of the electrical energy store. In the case of a device battery or a battery module or a battery cell, the state of health can be indicated as a capacity retention rate (SOH-C) or as a rise in the internal resistance (SOH-R). The capacity retention rate SOH-C is indicated as a ratio of the measured present capacity to an initial capacity of the fully charged battery. The relative change in the internal resistance SOH-R rises as the battery ages.

The above method now makes provision for the model parameters of the electrochemical battery model for a specific battery to be ascertained depending on data from a plurality of further batteries. To this end, operating feature points of further batteries that are similar to a current operating feature point of the specific battery are selected in particular using a clustering method and in each case the associated model parameters of the electrochemical battery model are determined for the selected operating feature points. The model parameters of the current operating feature point of the specific battery and the selected operating feature points of the further batteries are each combined with one another using a fusing method in order to obtain fused model parameters for the battery model of the specific battery.

In this way, the model parameters of the electrochemical battery model can be ascertained more accurately even in the case of measurement inaccuracies of a piece of state of health information obtained for example through measurement or the operating variables of the specific or the further batteries. The model parameters of the electrochemical battery model are now suitable for ascertaining the state of health in an electrochemical state of health model or using same in a no-load characteristic curve model.

Provision can also be made for states of health to be provided at least for a portion of the current operating feature point of the specific battery and the operating feature points for the further batteries and for operating feature points that are similar to the current operating feature point of the specific battery to be selected depending on the states of health of the respective operating feature point.

Provision can be made for the states of health to each be determined based on a measurement, in particular based on a coulomb counting method, wherein the model parameters of the battery of the relevant operating feature point are updated depending on the measurement and on characteristics of operating variables of the relevant battery.

As an alternative, a state of health model can be provided based on the battery model in order to model a respective state of health with respect to the current operating feature point of the specific battery and with respect to the operating feature points of the further batteries, wherein operating feature points that are similar to the current operating feature point of the specific battery are selected depending on the states of health of the respective operating feature point.

Furthermore, operating feature points of the further batteries that are similar to the current operating feature point of the specific battery can be selected using a clustering method, in particular k-means.

According to one embodiment, the method can be executed in a central processing unit, wherein the fused model parameters are transmitted to the device having the battery in order to update the battery model there.

Furthermore, fused model parameters can be ascertained by virtue of the model parameters that are respectively associated with the current operating feature point of the battery and the selected operating feature points of the further batteries each being combined using a Kalman filter or a Luenberger observer or each being averaged or each being averaged in a weighted manner depending on the similarities.

According to a further aspect, provision is made for an apparatus for parameterizing an electrochemical battery model of a specific battery of a device, in particular in a central processing unit, which is communicatively connected to a plurality of batteries, comprising the following steps:

providing a current operating feature point of the specific battery and operating feature points for further batteries of a plurality of further devices for various evaluation periods, wherein the operating feature points characterize the operation of the respective battery within one or more evaluation periods based on several operating features, wherein the operating features are produced depending on characteristics of operating variables of the respective battery;

selecting operating feature points of the further batteries that are similar to the current operating feature point of the specific battery;

providing model parameters of the battery model that are associated with the current operating feature point and the selected operating feature points;

ascertaining at least one fused model parameter depending on the model parameters of the current operating feature point of the specific battery and the selected operating feature points of the further batteries;

signaling the at least one fused model parameter or updating the battery model using the at least one fused model parameter.

Furthermore, the device having the specific battery can correspond to a motor vehicle, a pedelec, an aircraft, in particular a drone, a machine tool, an autonomous robot and/or a domestic appliance.

BRIEF DESCRIPTION OF THE DRAWINGS

Embodiments are explained in more detail below with reference to the appended drawings, in which.

DETAILED DESCRIPTION

The method according to the disclosure is described below on the basis of vehicle batteries as an electrical energy store in a plurality of motor vehicles as similar battery-operated devices. A physical state of health model for the respective vehicle battery can be implemented in a control unit in the motor vehicles. The state of health model can be continually or regularly updated or retrained in a central processing unit based on operating variables of the vehicle batteries from the vehicle fleet.

The example above is representative of a plurality of stationary or mobile devices with mains-independent supply of power, such as for example vehicles (electric vehicles, pedelecs, etc.), installations, machine tools, domestic appliances, IOT devices and the like, that are connected to a central processing unit (cloud) by way of an appropriate communication connection (e.g. LAN, Internet).

Figure 1:
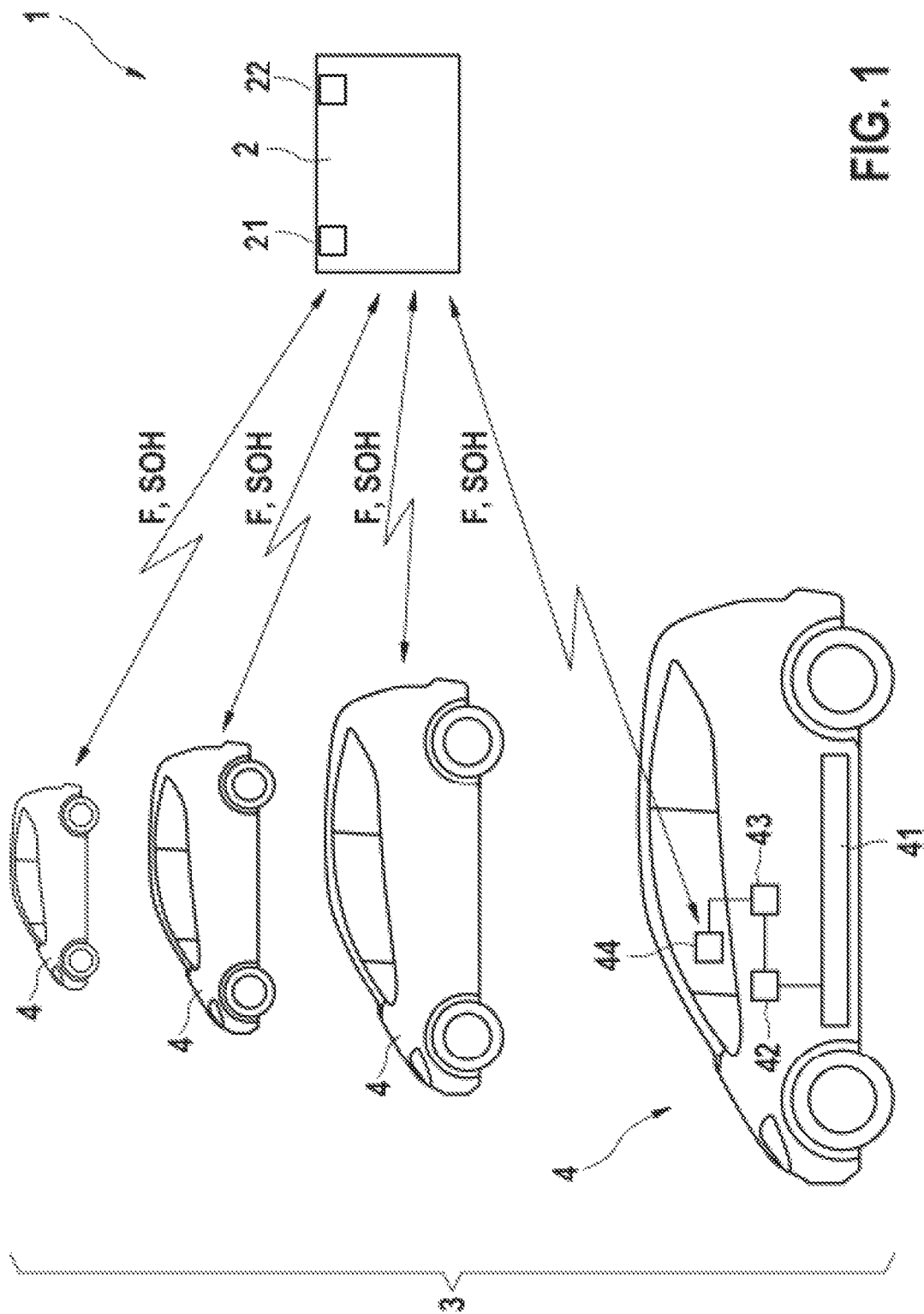
FIG. 1 shows a schematic illustration of a system for providing driver-individual and vehicle-individual operating variables for determining a state of health of a vehicle battery in a central processing unit.

FIG. 1 shows a system 1 for collecting fleet data in a central processing unit 2 for the purpose of producing and operating and also evaluating a state of health model. The state of health model is used to determine a state of health of an electrical energy store, such as for example a vehicle battery in a motor vehicle. FIG. 1 shows a vehicle fleet 3 with multiple motor vehicles 4.

One of the motor vehicles 4 is shown in more detail in FIG. 1. The motor vehicles 4 each have a vehicle battery 41 as a rechargeable electrical energy store, an electrical drive motor 42 and a control unit 43. The control unit 43 is connected to a communication module 44 that is suitable for transferring data between the respective motor vehicle 4 and a central processing unit 2 (cloud).

The central processing unit 2 has a data processing unit 21, in which the method described below can be executed, and a database 22 for storing state of health characteristics of batteries of a plurality of vehicles 4 of the vehicle fleet 3.

The motor vehicles 4 transmit the operating variables F, which at least indicate variables that influence the state of health of the vehicle battery, to the central processing unit 2. In the case of a vehicle battery, the operating variables F can indicate a present battery current, a present battery voltage, a present battery temperature and a present state of charge (SOC), at pack, module and/or cell level alike. The operating variables F are captured in a fast time frame of between 2 Hz and 100 Hz and can be transferred to the central processing unit 2 in uncompressed and/or compressed form on a regular basis. By way of example, the time series can be transferred to the central processing unit 2 in blocks at intervals of between 10 min and several hours.

Operating features that relate to an evaluation period can be generated from the operating variables F in the central processing unit 2, or in other embodiments also in the respective motor vehicles 4 already. The evaluation period for determining the state of health can be between a few hours (for example 6 hours) and several weeks (for example one month). A customary value for the evaluation period is one week.

The operating features can for example comprise features referenced to the evaluation period and/or accumulated features and/or statistical variables ascertained over the entire life hitherto. In particular, the operating features can for example comprise: histogram data for the state of charge characteristic, the temperature, the battery voltage, the battery current, in particular histogram data regarding the battery temperature distribution over the state of charge, the charging current distribution over the temperature and/or the discharge current distribution over the temperature, accumulated total charge (Ah), an average capacity increase during a charging process (in particular for charging processes in which the charge increase is above a threshold proportion (e.g. 20%) of the total battery capacity), a maximum for the differential capacity (dQ/dU: change of charge divided by change of battery voltage), and more. If known, electrochemical states (layer thicknesses, concentrations, cyclizable lithium, . . . ) can also be used as operating features.

The operating features reveal further details: a temporal load pattern such as charging and driving cycles, determined by usage patterns (such as for example fast charging at high current levels or sharp acceleration or regenerative braking processes), a usage period for the vehicle battery, a charge accumulated over the operating time and a discharge accumulated over the operating time, a maximum charging current, a maximum discharge current, a frequency of charging, an average charging current, an average discharge current, a power throughput during charging and discharge, an (in particular average) charging temperature, an (in particular average) spread of the state of charge, and the like.

A respective physical state of health model is implemented in the motor vehicles 4. The state of health model can be used on a regular basis, that is to say after the respective evaluation period has elapsed, to ascertain the present state of health of the vehicle battery 41 based on the operating features. In other words, it is possible to ascertain a state of health of the relevant vehicle battery 41 based on the operating features obtained from the operating variable characteristics of one of the motor vehicles 4 of the fleet 3.

The state of health model is based on an electrochemical battery model of the battery cell and the cell chemistry. The battery model is formed by a series of differential equations, which comprise the behavior of the battery characterization and in particular electrochemical states of equilibrium as model parameters. The model parameters can include for example layer thicknesses such as the SEI thickness, a change in the cyclizable lithium due to anode-cathode secondary reactions, rapid consumption of electrolytes, slow consumption of electrolytes, a loss of the active material in the anode, a loss of the active material in the cathode, and the like. This battery model ascertains internal physical battery states on the basis of the characteristics of the operating variables F in order to provide a physically based state of health in the form of a capacity retention rate (SOH-C) and/or an internal resistance rate of rise (SOH-R).

The electrochemical battery model can be used in the state of health model or else in a state of charge model that is based on a no-load characteristic curve determined by the battery model.

Figure 2:
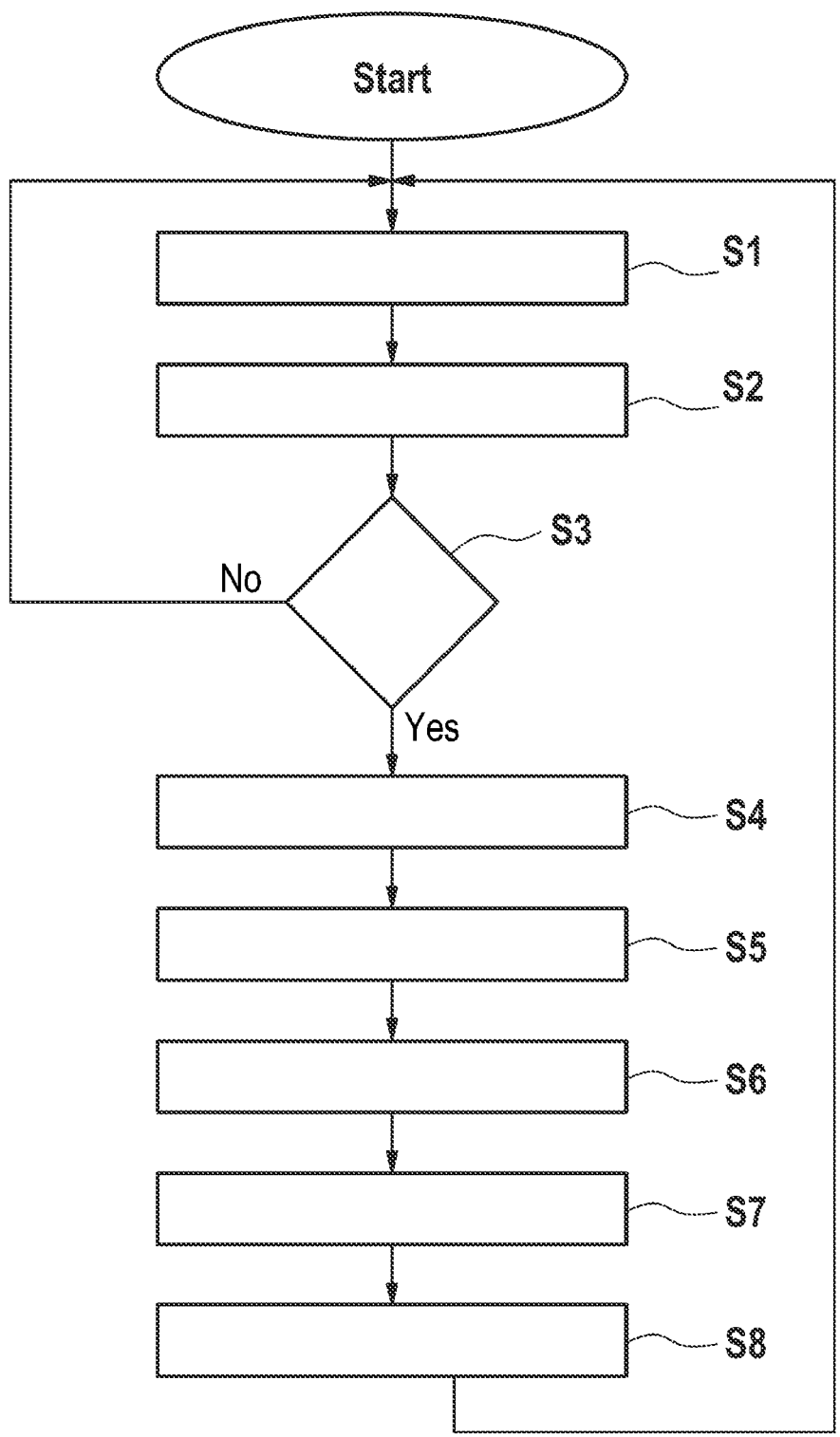
FIG. 2 shows a flowchart to illustrate a method for providing a state of health model in the central processing unit.

FIG. 2 illustrates a flowchart that describes the procedure of a method for identifying model parameters for an electrochemical battery model based on fleet data from batteries in a plurality of motor vehicles 4. The method can be executed partly or fully in the central processing unit 2.

The method is implemented in the data processing unit 21 of the central processing unit 2 as software and/or as hardware.

In step S1, the operating variables F are continuously received in the central processing unit 2 from the plurality of motor vehicles 4, such that the characteristics of the operating variables are available in the central processing unit 2. In addition, respective physical state of health models, which are based on an electrochemical battery model, are implemented in the motor vehicles 4. The electrochemical battery model is initially parameterized using model parameters.

In addition, in step S2, full charging or discharge cycles within the context of a coulomb counting method are executed in the vehicles 4 either triggered by a specific operating state or randomly, said cycles making it possible to specify information about the state of health SOH in the form of a maximum capacity (capacity retention rate (SOH-C) or as an internal resistance rate of rise (SOH-R). This information makes it possible to update the parameterization of the model parameters of the electrochemical battery model by methods that are known per se in principle based on an electrochemical battery model that is used by a state of health model. The state of health SOH is also transmitted to the central processing unit 2.

In step S3, a check is carried out for each vehicle battery 41 to determine whether the state of health of the vehicle battery 41 has decreased by a predefined incremental relative amount, such as for example by 2%. If this is the case (alternative: Yes), the method continues with step S4 for the relevant specific vehicle battery 41; otherwise, there is a return to step S1. This criterion triggers the updating of the model parameters of the electrochemical battery model.

In step S4, corresponding model parameters of the electrochemical battery model can now be updated based on the states of health of the vehicles 4 measured in step S2. In this way, there are always current model parameters for the battery models of the vehicle battery 41 of the vehicles 4 of the vehicle fleet 3 present in the central processing unit 2.

In step S5, operating features of the batteries 41 in the plurality of vehicles 4 are subsequently ascertained based on the characteristics of the operating variables such as battery current, battery voltage, battery temperature and state of charge. As described above, the operating features are ascertained at various evaluation times with which a respective modeled or measured state of health can be associated. Present in the database 22 for each vehicle battery 41 of the vehicles are thus the last ascertained model parameters of the electrochemical battery model, the measured or modeled state of health and a respective operating feature point for each evaluation period, which indicates the entirety of the operating features of the respective vehicle battery 41.

Based on the current operating feature point of the specific vehicle battery 41 and the operating feature points of the batteries 41 of the vehicles 4 of the vehicle fleet 3 and possibly the respectively associated state of health SOH, in step S6 similar further batteries with similar battery states can now be selected using a clustering method for the specific vehicle battery 41 for which the model parameters of the battery model are intended to be updated. The selection is made from the set of operating feature points for each of the batteries 41 since the beginning of the respective start-up and the model parameters present at this respective time or evaluation period.

Figure 3:
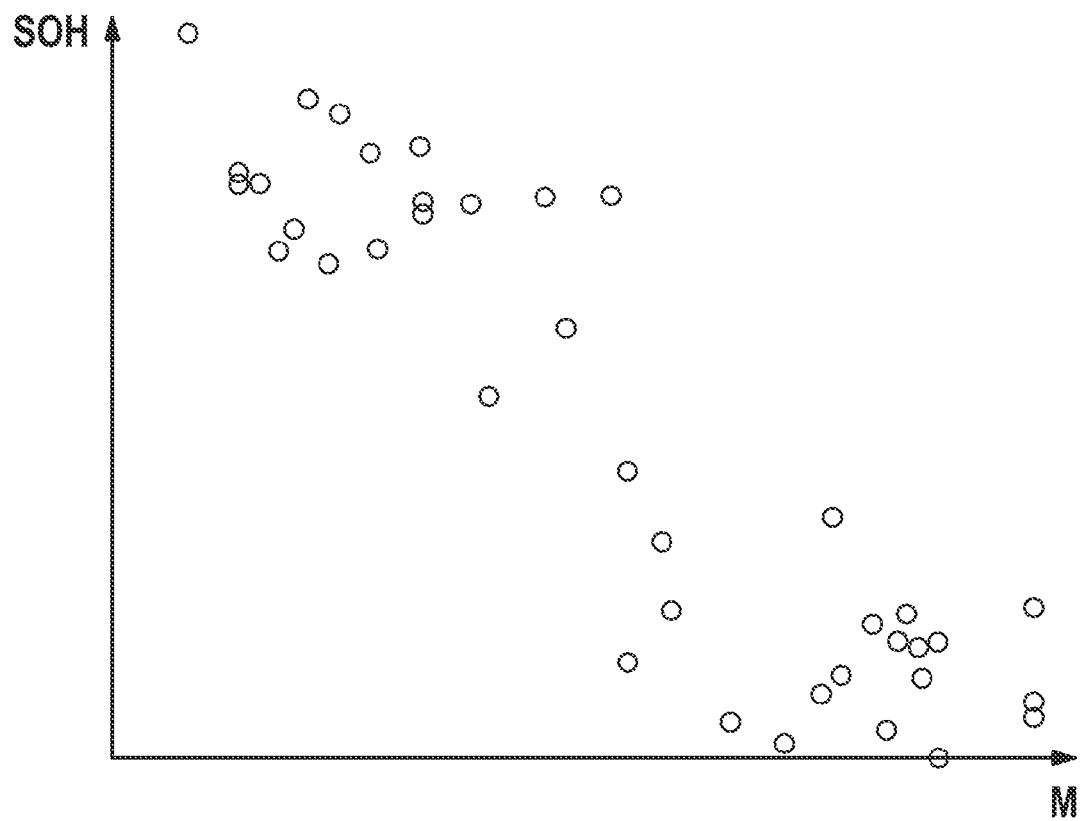
FIG. 3 shows a graph for illustrating an operating feature and the states of health of a plurality of vehicle batteries.

In FIG. 3, an operating feature M is plotted by way of example against a state of health for a plurality of batteries 41. For example, two clusters are produced. By applying the clustering method, similar operating feature points that have been determined currently or in the past for the further vehicle batteries can be ascertained in a simple manner for a current operating feature point of the specific vehicle battery 41.

By applying the clustering method, such as for example k-means, operating feature points of other vehicle batteries that are similar to the operating feature point of the specific battery under consideration are identified. All operating feature points that are at a Euclidean distance from the current operating feature point which is lower than a prescribed threshold value are similar. As an alternative, the distance from a centroid of an identified cluster in which the current operating feature point is located can also be selected. The associated batteries of the plurality of batteries of the vehicle fleets and the model parameters for the respective electrochemical battery model that are applicable for the evaluation period of the identified operating feature point are identified accordingly using the operating feature points.

As an alternative to the continuously updated model parameters of the electrochemical battery model for each vehicle battery in step S4, the model parameters can also be determined only for the selected operating feature points. This is done based on the operating variables of the evaluation period identified by the operating feature point, said variables being associated with the assigned battery, and the measured state of health, in particular using an optimization method. The determination of the model parameters of the respective electrochemical battery model for the selected operating feature points is accordingly triggered by virtue of the specific battery that is similar to the selected batteries having achieved a specific change in its state of health.

Corresponding model parameters of the electrochemical battery model are now obtained for the specific battery and for the selected batteries.

In a subsequent step S7, the model parameters ascertained in this way are fused with one another in order to obtain the adjusted model parameters for the specific battery. For example, the individual model parameters for the operating feature points under consideration can each be fused by a Kalman filter or a Luenberger observer in order to obtain updated model parameters. As an alternative, the model parameters can each be averaged or averaged in a weighted manner. The weightings therefor can be produced from the Euclidean distance from the centroid of the cluster ascertained for the specific vehicle battery or from the distance from the operating feature point of the specific vehicle battery 41.

In this way, it is possible to update the model parameters for a specific battery based on fleet data of a plurality of batteries.

In step S8, the fused model parameters ascertained in this way are transmitted to the vehicle having the specific vehicle battery and used there in the electrochemical battery model to determine the state of health or to determine the state of charge.

What is claimed is:

1. A method for parameterizing an electrochemical battery model of a specific battery of a device, comprising:
providing a current operating feature point of the specific battery and operating feature points of further batteries of a plurality of further devices for various evaluation periods, wherein the operating feature points of the further batteries characterize an operation of a respective further battery within one or more of the evaluation periods based on several operating features, wherein the several operating features are produced depending on characteristics of operating variables of the respective further battery;
selecting operating feature points of the further batteries that are similar to the current operating feature point of the specific battery;
providing model parameters of the electrochemical battery model that are associated with the current operating feature point and the selected operating feature points;
ascertaining at least one fused model parameter depending on the model parameters of the current operating feature point of the specific battery and the selected operating feature points of the further batteries; and
signaling the at least one fused model parameter or updating the electrochemical battery model using the at least one fused model parameter.

2. The method according to claim 1, further comprising:
providing states of health at least for a portion of the current operating feature point of the specific battery and the operating feature points of the further batteries; and
selecting operating feature points that are similar to the current operating feature point of the specific battery depending on the states of health of respective operating feature points.

3. The method according to claim 2, further comprising:
determining each of the states of health based on a measurement; and
updating the model parameters of the battery of a relevant operating feature point depending on the measurement and on characteristics of the operating variables of the respective battery.

4. The method according to claim 2, further comprising:
providing a state of health model based on the electrochemical battery model in order to model a respective state of health of the states of health with respect to the current operating feature point of the specific battery and with respect to the operating feature points of the further batteries,
wherein the operating feature points that are similar to the current operating feature point of the specific battery are selected depending on the states of health of the respective operating feature point.

5. The method according to claim 1, further comprising:
selecting operating feature points of the further batteries that are similar to the current operating feature point of the specific battery using a clustering method.

6. The method according to claim 1, wherein:
the method is executed in a central processing unit, and
the at least one fused model parameter is transmitted to the device having the specific battery in order to update the electrochemical battery model.

7. The method according to claim 1, further comprising:
ascertaining the at least one fused model parameters by virtue of the model parameters that are respectively associated with the current operating feature point of the battery and the selected operating feature points of the further batteries each being combined using a Kalman filter or a Luenberger observer or each being averaged or each being averaged in a weighted manner depending on the similarities.

8. The method according to claim 1, wherein the device having the specific battery corresponds to a motor vehicle, a pedelec, an aircraft, a drone, a machine tool, an autonomous robot, and/or a domestic appliance.

9. The method according to claim 1, wherein a computer program product comprises instructions that, when the computer program is executed by at least one data processing device, causes said at least one data processing device to perform the method.

10. The method according to claim 9, wherein the computer program product is stored on a non-transitory machine-readable storage medium.

11. An apparatus for parameterizing an electrochemical battery model of a battery in a device, comprising:
a central processing unit communicatively connected to a plurality of batteries, the central processing unit configured to:
provide a current operating feature point of the specific battery and operating feature points of further batteries of a plurality of further devices for various evaluation periods, wherein the operating feature points of the further batteries characterize an operation of a respective further battery within one or more of the evaluation periods based on several operating features, wherein the several operating features are produced depending on characteristics of operating variables of the respective further battery;
select operating feature points of the further batteries that are similar to the current operating feature point of the specific battery;
provide model parameters of the electrochemical battery model that are associated with the current operating feature point and the selected operating feature points;
ascertain at least one fused model parameter depending on the model parameters of the current operating feature point of the specific battery and the selected operating feature points of the further batteries; and
signal the at least one fused model parameter or updating the electrochemical battery model using the at least one fused model parameter.

* * * * *